United States Patent [19]

Idesawa

[11] Patent Number: 5,138,146
[45] Date of Patent: Aug. 11, 1992

[54] IMAGE POSITION SENSITIVE DEVICE WITH MULTIPLE OUTPUT ELECTRODES

[75] Inventor: Masanori Idesawa, Wako, Japan

[73] Assignee: Rikagaku Kenkyusho, Japan

[21] Appl. No.: 587,009

[22] Filed: Sep. 24, 1990

[30] Foreign Application Priority Data

Sep. 26, 1989 [JP] Japan .................. 1-249723

[51] Int. Cl.⁵ .............................................. H01J 40/14
[52] U.S. Cl. .................. 250/211 R; 250/206.1
[58] Field of Search ............. 250/206.1, 206.2, 208.2, 250/211 R, 211 K; 357/32

[56] References Cited

U.S. PATENT DOCUMENTS

| | | | |
|---|---|---|---|
| 3,984,677 | 10/1976 | Hosoe et al. | 250/208.2 |
| 4,841,138 | 6/1989 | Muro | 250/206.1 |
| 4,849,781 | 7/1989 | Nakazawa et al. | 250/214 P |
| 4,874,939 | 10/1989 | Nishimoto et al. | 250/211 K |
| 4,961,096 | 10/1990 | Idesawa | 357/32 |

OTHER PUBLICATIONS

Petersson et al., "Position Sensitive Light Detectors with High Linearity," IEEE Journal of Solid-State Circuits, vol. SC-13, No. 3, Jun. 1978, pp. 392-399.

M. Idesawa, "High-Precision Image Position Sensing Methods Suitable for 3-D Measurement," Optics and Lasers in Engineering 10 (1989), pp. 191-204.

*Primary Examiner*—David C. Nelms
*Assistant Examiner*—John R. Lee
*Attorney, Agent, or Firm*—Brumbaugh, Graves, Donohue & Raymond

[57] ABSTRACT

In an image position sensitive device having a photo conductive layer, resistive layer and a group of the output electrodes for separating the resistive layer into a plurality of sections, the group of the output electrodes is divided into a plurality of sets and a common output terminal is provided for each set of the electrodes in order to collectively detect output currents from the electrodes of each set. The number of output terminal is extremely reduced to simplify conformation of a circuit for determining a detection region.

4 Claims, 4 Drawing Sheets

OUTPUT BETWEEN Ta-Tb

OUTPUT BETWEEN Tc1-Tc2

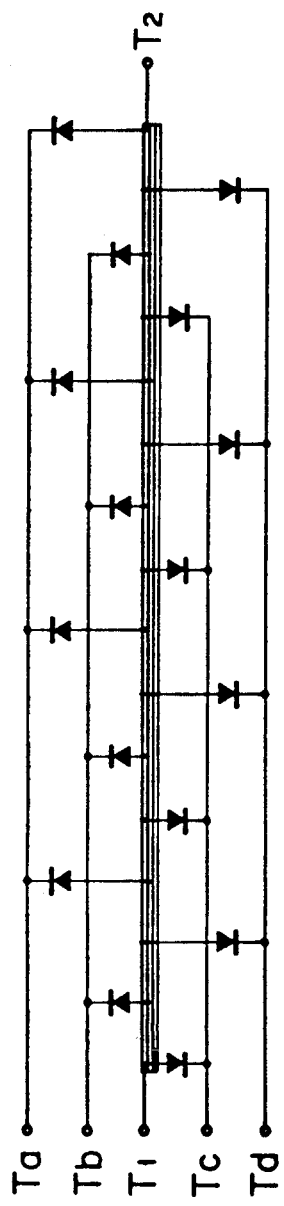
FIG. 2A
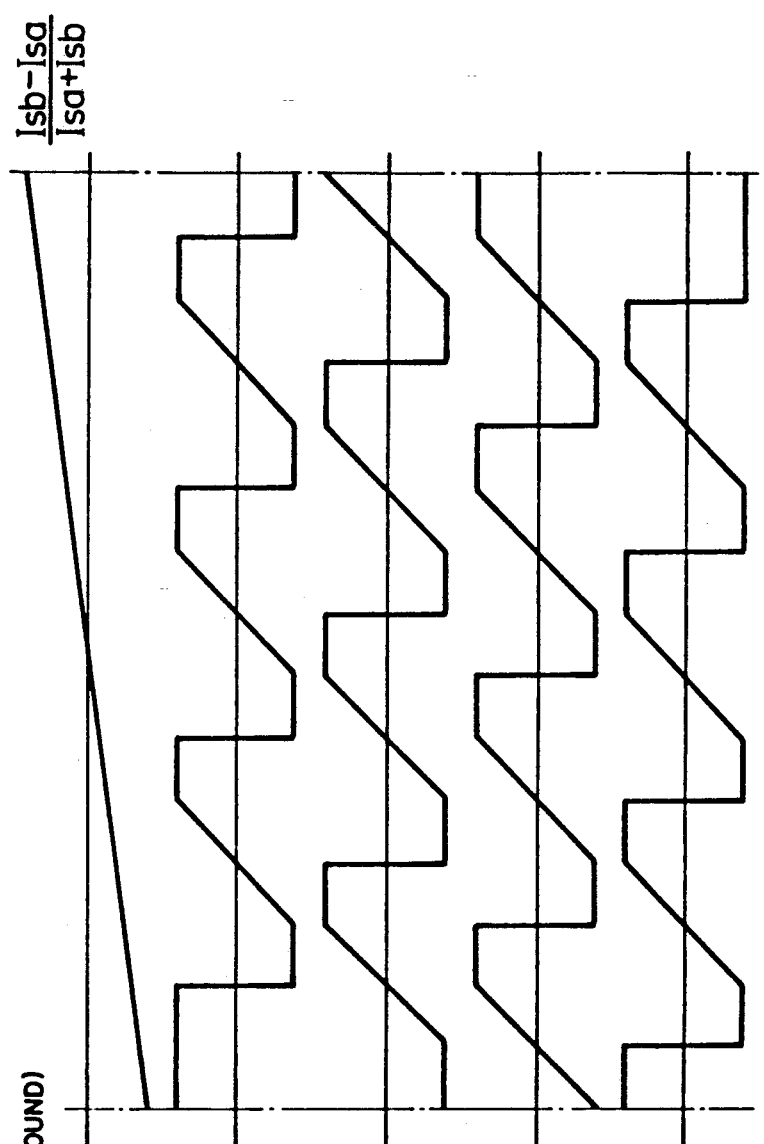
FIG. 2B (T₁ T₂)
FIG. 2C (Ta Tb Td)
FIG. 2D (Tb Ta Tc)
FIG. 2E (Tc Td Ta)
FIG. 2F (Td Tc Tb)

IMAGE POSITION SENSITIVE DEVICE WITH MULTIPLE OUTPUT ELECTRODES

FIELD OF THE INVENTION

This invention relates to a light incident position sensitive device comprising a group of output electrodes which separates a resistive layer into a plurality of sections and which calculates the light incident position from output currents detected by a selected pair of the electrodes, more particularly to an image position sensitive device with multiple output electrodes which extremely increase resolution in image position sensing in a semiconductor image position sensitive device (hereinbelow referred to as PSD).

BACKGROUND OF THE INVENTION

As a light spot image position sensitive device, the PSDs are widely used. In the PSDs, photo currents generated at the light incident position are detected through the resistive layer, the detected current values are calculated in analog form to rapidly obtain a center position of the light spot.

FIG. 4a shows a cross section of PSD, and FIG. 4b shows its equivalent circuit. A resistive layer R, a photo conductive layer P and a bias layer C make up the PSD. When light L is incident, photo currents are generated in the photo conductive layer P at the incident position. These photo currents enter into the resistive layer R at the light incident position due to an electric field produced by a bias electrode $T_{cb}$ and flow through the resistive layer in opposite directions. From output electrodes $T_1$ and $T_2$ provided at opposite ends of the PSD, the photo currents are obtained as output currents $I_a$ and $I_b$. In the equivalent circuit shown in FIG. 4B, the photo currents entered into the resistive layer R from the light incident position are divided according to the ratio of resistance value between the light incident position and the output terminal $T_1$ to that between the output terminal $T_2$ and the light incident position. From the divided currents outputted from the respective output terminals as output currents $I_a$ and $I_b$, a deviation coefficient of resistance values between the light incident position and the center position of resistance can be calculated from the following formula.

$$X = \frac{I_b - I_a}{2(I_a + I_b)}$$

Assume that the resistivity of the resistive layer is uniform, the resistance value is proportional to the length. Since the above calculated value X indicates the deviation coefficient of the light incident position from the center of the resistive layer, the light incident position can be obtainable by multiplying the length of the resistive layer R with the deviation coefficient. This calculation is usually carried out by such an analog operational circuit that a selection switch $S_w$ is eliminated from the circuit shown in FIG. 3D, that is, the output currents $I_a$ and $I_b$ pass through a buffer amplifier B, two operational amplifiers Σ and a divider D. The obtained analog value is converted to a digital value $X_d$ by an analog-digital converter A/D. The relative resolution in image position sensing, that is, relative resolution of the image position sensitive section greatly depends on the accuracy of the analog signal processing circuit and also it is restricted by the resolution of the analog signal processing circuit and the analog-digital converter. A resolution of about 1/1000 can be easily obtained, but obtaining higher resolution is expensive and it is difficult to attain a resolution higher than 1/10,000. RIKEN hybrid type semiconductor image position sensitive device (hereinbelow referred to as R-HPSD) has been provided in Japanese Patent Application Disclosure No. 64-10108. This device has a plurality of output electrodes and increases the relative resolution in image position sensing by a factor of ten while the resolutions of the analog signal processing circuit and the A/D converter are unchanged.

FIG. 3A to FIG. 3D shows a concept of the R-HPSD which increases the relative resolution in image position sensing more than ten times without increasing the accuracy of the analog signal processing system. FIG. 3A shows a cross section of the R-HPSD in which output electrodes $T_2 \ldots T_5$ are further provided between the electrodes $T_1$ and $T_2$ of FIG. 4A. Since other features of the R-HPSD are the same as the conventional PSD of FIG. 4A, those features will not be described in detail herein. In FIG. 3B, the output electrodes ($T_1$ and $T_6$) at the opposite ends are selected to detect in which one of the sections light is incident. Next, the electrodes at the both ends of the light incident section are selected to detect an image position within the selected section. The image position over the whole sensitive region is determined by adding the detected position within the selected section to the position of the selected electrode. The positions of the output electrodes are precisely settled by use of the technology for fabricating integrated circuits. The image position within the selected section is detected with a resolution defined by the accuracy of the analog signal processing system. Therefore, the resolution over the whole sensitive region is increased by a factor of the number of the sections compared with the conventional PSD. FIG. 3C shows output signals indicating image position obtained from output currents $I_a$ and $I_b$ of the electrodes straddling the whole region ($S_{16}$) between the electrodes $T_1$ and $T_6$ or an individual section ($S_{12} \ldots S_{56}$) among the electrodes $T_1$ to $T_6$, that is, $(I_b - I_a)/(I_a + I_b)$. FIG. 3D shows the concept of a output electrode selection circuit and an analog signal processing circuit. The output electrodes are selected by the selection switch circuit $S_w$. Since subsequent processing to obtain the light incident position within a section is the same as in the case of the conventional PSD shown in FIGS. 4A and 4B, the processing will not be described again.

Now, in the R-HPSD, the larger of the number of the output electrodes, that is, the larger of the number of the sections, the more advantageous to increase the relative resolution. However, when the number of the output electrodes is increased, the number of the switch elements of the output electrode selection circuit is also increased. Thus, if the switch elements are provided at the outside of the image position sensitive device, the number of output terminals leading to the switch elements is extremely increased. The output electrode selection circuit may be integrated with the image position sensitive device and this is ideal, but to develop an integrated circuit of the analog switch circuits greatly increases the costs.

As described above, in the R-HPSD, the relative resolution in sensing is improved by increasing the number of the output electrodes. However, a problem is arises regarding the output electrode selection circuit.

In other words, switch elements for selecting the output electrodes are needed and structure and the control of the output electrode selection circuit are complicated. As a result, a new disadvantage is created, thereby reducing the inherent simplicity of the PSD.

SUMMARY OF THE INVENTION

In order to solve the above disadvantage, in this invention, a plurality of the output electrodes which are provided to separate the resistive layer into a plurality of sections are divided into a plurality of sets and a common output terminal is provided for each set of the output electrodes to collectively detect the output currents from a set of the output electrodes.

By selecting a pair of output terminals from among the output terminals the number of which is much less than the number of the electrodes used to separate the resistive layer into a plurality of sections, the output currents for determining the position within the light incident section are detected.

According to this invention, in spite of a plurality of the sections, the number of the output terminals is reduced, therefore, the configuration of a circuit for determining a detection region becomes simpler.

BRIEF DESCRIPTION OF THE DRAWINGS

FIGS. 2A to 2F show explanatory diagrams illustrating an actual embodiment according to this invention.

DETAILED DESCRIPTION OF THE PREFERRED EMBODIMENT

Hereinbelow, referring to FIGS. 1A to 1E, this invention and its advantages are explained based on a simple embodiment of this invention.

Figure 1A:
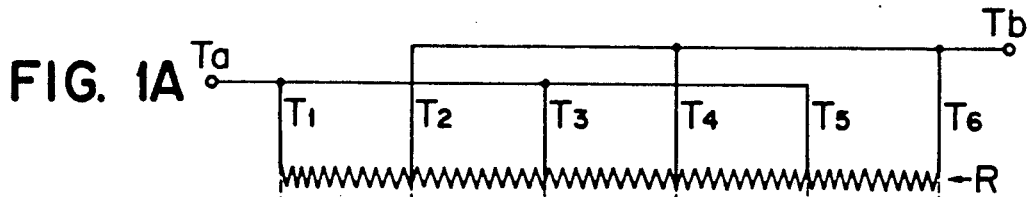
FIGS. 1A to 1E show explanatory diagrams illustrating a simple embodiment according to this invention for understanding a principle of this invention.
Figure 1B:
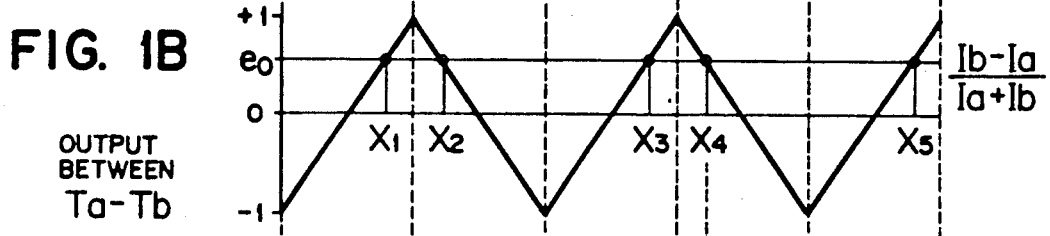
Figure 1C:
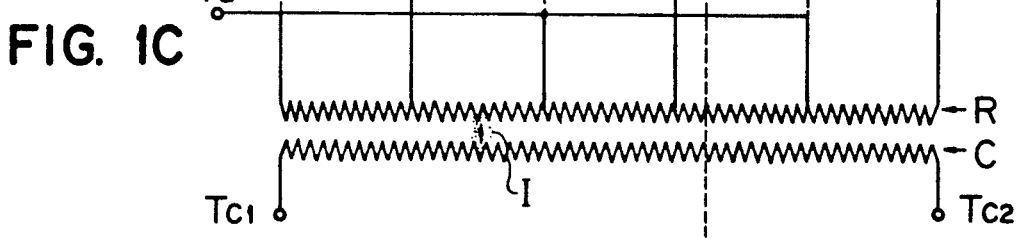
Figure 1D:
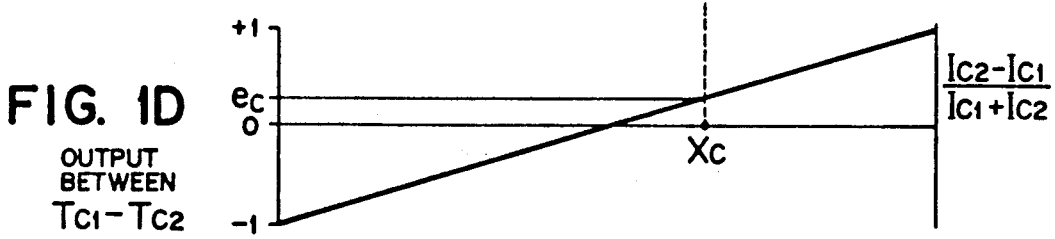
Figure 3A:
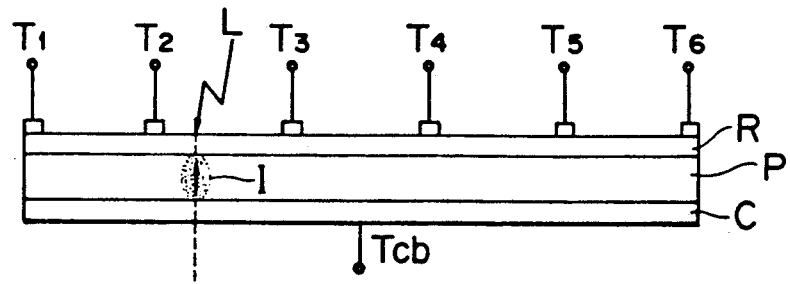
FIGS. 3A to FIG. 3D show explanatory diagrams illustrating a principle of a prior art semiconductor image position sensitive device with multiple output electrodes based on the R-HPSD.
Figure 3B:
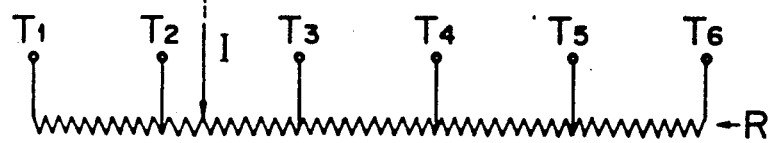
Figure 3C:
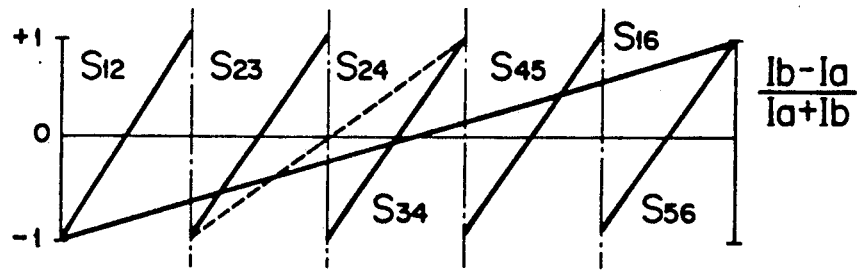

FIG. 1A shows an example where a group of the output electrodes is divided into two sets, that is, ($T_1$, $T_3$, $T_5$) and ($T_2$, $T_4$, $T_6$). and output currents from the electrodes of the sets are collectively taken out from common output terminals $T_a$ and $T_b$. The image position sensing characteristic $(I_b - I_a)/(I_a + I_b)$ in this case is shown in FIG. 1B, where $I_a$ and $I_b$ are currents from the terminals $T_a$ and $T_b$, respectively. That is to say, it has a triangle wave form which is folded back at each edge of the separated resistive sections and has an extremely enhanced sensitivity. By the way, when an output value $e_0$ is obtained, it cannot be distinguished which one of the positions $X_1$, $X_2$, $X_3$, $X_4$ and $X_5$ is the actual image position. As a result, in the configuration of FIG. 1A, the light incident section cannot be found. Therefore, in this invention, output terminals $T_{c1}$ and $T_{c2}$ are provided at ends of the bias layer C of FIG. 3A, so that the bias layer C also acts as a resistive layer. The equivalent circuit in this case is shown in FIG. 1C. By processing detected currents from the output terminals $T_{c1}$ and $T_{c2}$, an output characteristic $(I_{c2} - I_{c1})/(I_{c1} + I_{c2})$ shown in FIG. 1D is obtained, where $I_{c1}$ and $I_{c2}$ are currents from the terminals $T_{c1}$ and $T_{c2}$, respectively. (This operation can be carried out simultaneously with the processing of the currents from the terminals $T_a$ and $T_b$.) Then, if an output value obtained by processing the output signals from the terminals $T_{c1}$ and $T_{c2}$ is $e_c$, it can be found that the light incident position is $X_c$ and the light incident position is in a section between the output electrodes $T_4$ and $T_5$. From the output value $e_0$ calculated from the output currents from the output terminals $T_a$ and $T_b$, the image position $X_4$ between $T_4$ and $T_5$ is defined with a high resolution.

Figure 1E:
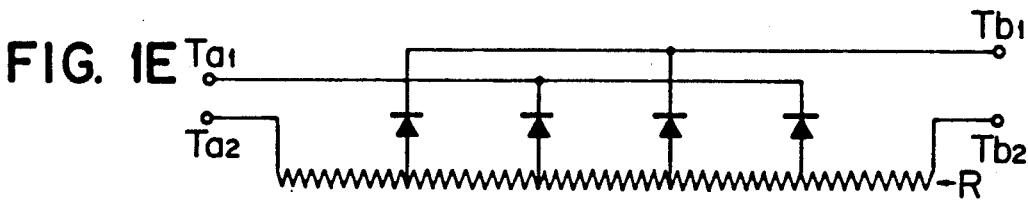

FIG. 1E shows a modified embodiment of this invention in which diode elements are inserted so that the currents from the output electrodes flow in one direction. Four diode elements are provided to the output electrodes between the edge terminals ($T_{a2}$, $T_{b2}$). In this construction, by selecting the output terminals $T_{a2}$ and $T_{b2}$ and processing the output currents, the same characteristics as those in the FIG. 1D, that is, the characteristics for detecting the image position over the whole sensitive region can be realized. By processing combined output currents from the terminals $T_{a1}$ and $T_{a2}$ and combined output currents from the terminals $T_{b1}$ and $T_{b2}$, detection of light incident position is carried out from the same characteristics as in FIG. 1B. Namely, even if the resistive layer is a single layer, detection of light incident section becomes possible without interference between the output electrodes because of the diode elements.

Figure 3D:
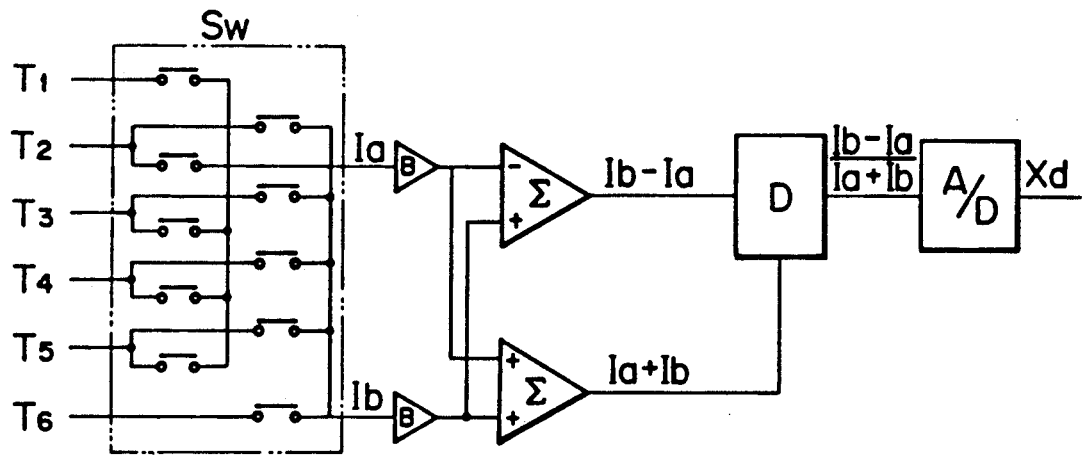
Figure 4A:
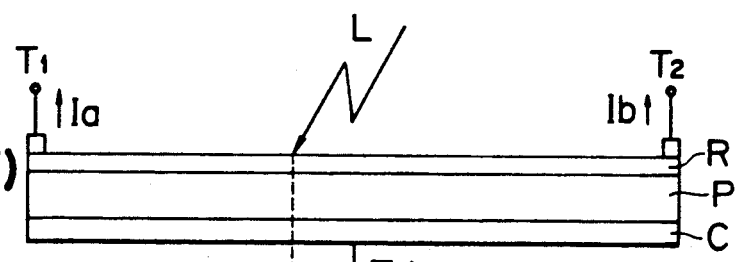
FIG. 4A and FIG. 4B show explanatory diagrams illustrating a principle of a prior art PSD.
Figure 4B:
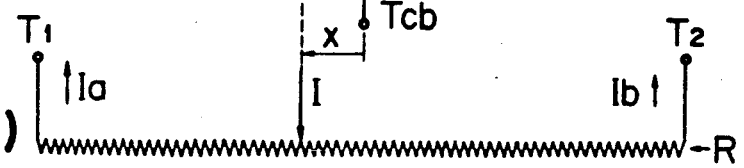

In connection with the above simple example of FIG. 1A where the group of the output terminals is divided into two sets, the principle, the operation and the advantages of this invention have been mentioned. In this case, as shown in FIG. 1B, the output characteristics are folded back at the edge of each section, so that it is needed to reverse the sign of the detected values every two sections. By grouping the group of output electrodes into three or more sets as shown in FIG. 2A, selecting two sets of the electrodes from among these sets and then connecting the common terminals of the two selected sets to the inputs of the analog signal processing circuit, the changing slope of the detected values within a selected section can be matched to the image position as will be described with reference to FIGS. 2B–2F;

FIG. 2A shows an actual embodiment of the image position sensitive device with multiple output electrodes in which a group of the electrodes is divided into four sets which are connected to respective output terminals $T_a$, $T_b$, $T_c$ and $T_d$ and edge output terminals $T_1$ and $T_2$ are further provided. Diode elements are also provided between the terminals and the electrodes between the edge electrodes. FIGS. 2B to 2F show detection characteristics, that is, $(I_{sb} - I_{sa})/(I_{sa} + I_{sb})$ where $I_{sa}$ and $I_{sb}$ are currents from two selected electrodes $T_{sa}$ and $T_{sb}$, respectively. The output terminals are selected by a terminal selection circuit to determine a detection region. Currents obtained from selected circuits are processed by analog and digital circuits which are the same as those of FIG. 3D. By selecting the terminals $T_1$ and $T_2$ from among the six terminals $T_a$–$T_d$, $T_1$ and $T_2$, detection characteristic as shown in FIG. 2B is obtained, thus the light incident section can be found. By selecting the terminals $T_a$ and $T_b$ and grounding the terminal $T_d$, detection characteristic as shown in FIG. 2C is obtained. By selecting the terminals $T_b$ and $T_d$ and grounding the terminal $T_c$, detection characteristic shown in FIG. 2D is obtained. By selecting the terminals $T_c$ and $T_d$ and grounding the terminal $T_a$, detection characteristic shown in FIG. 2E is obtained. And by selecting the terminals $T_d$ and $T_c$ and grounding the terminal $T_b$, detection characteristic shown in FIG. 2F is obtained. Usually, in analog signal processing systems for the semiconductor image position sensitive device, error factors such as dark current contribute less to the light incident positions around where the output signal is zero and relatively high accuracy operation is possible around there. In the embodiment of FIG. 2A, by considering the above fact, the detection regions used for the measurement (the slope portions) are overlapped, and the output terminals are selected so that the edge portions of a selected section are not used. At the same time, the error problem which is caused when a light spot straddles an output electrode can be avoided.

The above explanations have been made with the position sensitive device with a few or tens of output electrodes. However, this invention can much more effectively exhibit its advantages when the number of the separating output electrodes becomes larger. For instance, the advantages become remarkable when this invention is applied to an image position sensitive device with more than one hundred output electrodes. In other words, it is not practical to draw out leads from more than one hundred electrodes and it is very expensive to integrate the analog switch for exchanging the electrodes. According to this invention, the number of the output electrodes to be independently drawn out is greatly reduced by integrating diode elements which are very simple and can be fabricated easier than the analog switch. On the other hand, by dividing a group of the electrodes into a few sets and combining the electrodes of each set, the number of the electrodes to be drawn out is greatly reduced, so that an actual image position sesitive device with multiple output electrodes can be realzed.

It will be apparent to the person skilled in the art that various modifications and variations can be made in this invention without departing from the scope or spirit of this invention. Therefore, it is intended that this invention cover the modifications and variation of this invention so far as they fall within the scope of the following claims and their equivalents.

What is claimed is:

1. In an image position sensitive device with multiple output electrodes comprising a photo conductive layer, a first resistive layer and a group of output electrodes separating the first resistive layer into a plurality of sections, for determining an incident light position in a direction transverse to said group of output electrodes, the improvement comprising:

a first set of elongated substantially parallel output electrodes coupled to a first common output terminal, and arranged to divide a first resistive layer into a plurality of sections lying between said electrodes;

a second set of elongated substantially parallel output electrodes interdigitated with said first set and coupled to a second common output terminal, and arranged to divide said first resistive layer into a plurality of sections lying between individual electrodes of said first and second sets of electrodes; and a resulting plurality of sections of said first resistive layer, each of said sections lying between one of said output electrodes of said first set and one of said output electrodes of said second set with the width of each section determined by the spacing between said electrodes;

whereby a light incident position between an output electrode of said first set and an output electrode of said second set may be determined with increased accuracy as a result of the limited width of said sections of resistive layer in a direction transverse to said output electrodes.

2. The image position sensitive device with multiple output electrodes claimed in claim 1, wherein a diode element is inserted between each output electrode separating the first resistive layer and the respective common output terminal to which said output electrode is coupled so that output current from each output electrode flows in the same direction and detection of the light incidient position becomes possible without interference from the other output electrodes.

3. The image position sensitive device with multiple output electrodes claimed in claim 1, wherein each of said output electrodes has a length substantially coextensive with a first dimension of said first resistive layer and is arranged in spaced parallel relationship with the other output electrodes of said group of output electrodes for determining a light incident position along a second dimension of said first resistive layer transverse to said output electrodes.

4. The image position sensitive device with multiple output electrodes claimed in claim 1, additionally comprising:

a second resistive layer provided on the opposite surface of a photo conductive layer having a first surface supporting said first resistive layer; and two additional output electrodes on the surface of said second resistive layer in spaced relationship, substantially parallel to each other and to said output electrodes of said first and second sets of output electrodes.

* * * * *